United States Patent
Blackshear

(12) 
(10) Patent No.: US 6,312,972 B1
(45) Date of Patent: Nov. 6, 2001

(54) PRE-BOND ENCAPSULATION OF AREA ARRAY TERMINATED CHIP AND WAFER SCALE PACKAGES

(75) Inventor: Edmund D. Blackshear, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/370,732

(22) Filed: Aug. 9, 1999

(51) Int. Cl.[7] .............................. H01L 21/44; H01L 21/48; H01L 21/50

(52) U.S. Cl. ....................... 438/106; 438/118; 438/127

(58) Field of Search ..................................... 438/106, 127, 438/118

(56) References Cited

U.S. PATENT DOCUMENTS

| | | | |
|---|---|---|---|
| 3,983,458 | 9/1976 | Jordan et al. | 317/101 CP |
| 5,206,794 | 4/1993 | Long | 257/675 |
| 5,446,625 | 8/1995 | Urbish et al. | 361/761 |
| 5,663,106 | 9/1997 | Karavakis et al. | 29/841 |
| 5,700,723 | 12/1997 | Barber | 437/214 |
| 5,766,987 | 6/1998 | Mitchell et al. | 438/126 |
| 5,807,762 | 9/1998 | Akram et al. | 438/15 |
| 6,100,114 * | 8/2000 | Milkovich et al. | . |
| 6,117,706 * | 9/2000 | Yoshioka et al. | . |
| 6,168,972 * | 1/2001 | Wang et al. | . |
| 6,187,612 * | 2/2001 | Orcutt | . |

* cited by examiner

*Primary Examiner*—John F. Niebling
*Assistant Examiner*—Josetta I. Jones
(74) *Attorney, Agent, or Firm*—Jay H. Anderson; Cantor Colburn LLP

(57) ABSTRACT

A method of packaging an integrated circuit chip wherein the chip is encapsulated prior to mechanical bonding to a packaging substrate.

8 Claims, 2 Drawing Sheets

PRE-BOND ENCAPSULATION OF AREA ARRAY TERMINATED CHIP AND WAFER SCALE PACKAGES

BACKGROUND

The present invention relates to integrated circuit (IC) devices, and, in particular, is directed to the packaging of such semiconductor chips.

Packaging is one of the final steps in the process of manufacturing integrated circuits. In packaging, a fabricated IC is mounted within a protective housing. At the present moment, the art of semiconductor chip technology has evolved far more rapidly than the integrally related technology of packaging the integrated circuits.

The packaging requirements of the newer, smaller, more powerful integrated circuits are quickly progressing beyond the capabilities of traditional packaging technology and the conventional materials and designs presently utilized are fast becoming obsolete. The packaging demands of new IC devices require configurations to accommodate increasing numbers of electrical interconnections, space constraints due to decreasing size, reduction in costs, and increasing heat transfer capabilities.

One means of packaging an integrated circuit is to encapsulate the IC in a plastic material. Plastic packages, introduced decades ago, currently are utilized to package the vast majority of integrated circuits in the semiconductor chip industry. A typical area array plastic packaging operation involves the following sequence of steps:

1. In order to hold the chip in place, it first is bonded, generally using an epoxy, to a multilayer laminate substrate, composed of plastic insulator and conductive wiring layers.
2. The chip, held in place on the substrate, then is wire bonded to the substrate wiring layers.
3. The substrate and chip assembly is set within the cavity of a transfer molding fixture and a plastic composition is transferred to fill the cavity, encapsulated the chip, epoxy, bond wires, and substrate top.
4. The encased assembly is removed from the transfer molding fixture, and the array contacts such as pins, ball columns, or land coating are attached.
5. If required for heat dissipation, a heat sink is bonded to the encased assembly.

Wafer scale and real chip size packaging approaches are advantageous in that such packages provide the smallest possible package size for the integrated circuit. However, such customized packages are disadvantageous in their lack of versatility, in that they are limited to the size of the specific chip. Since IC manufacturers' profitability directly is related to the sizes of individual IC chips, reduction in chip sizes is a constant goal and frequently occurs. These reductions in chip sizes commonly impact the circuit board design of the wafer scale or real chip size package customer. Unfortunately, stability over die shrinks is a much needed, but not presently available, feature for these wafer or real chip size type of packages.

Reliability problems in IC packages can occur as the result of the fabrication process for such packages. For area array packages, the reliability of solder joints, in particular, is largely determined by the properties of the substrate to which solder balls are attached; as well as the adhesive layer bonding the substrate to the chip or to the balance of the chip package. To ensure integrity of solder joints, it is essential that there be no discontinuities in the flatness or mechanical stress state of the substrate over the entire package area. Traditional assembly techniques involve dispensing die attach adhesive only on the footprint area of the substrate to which the IC chip will be bonded, setting the chip onto the adhesive or the chip footprint to bond the chip to the substrate, and then encapsulating the chip and substrate package assembly with a thermally set plastic to stabilize the structure. A discontinuity in flatness and stress state results at the edge of the IC chip where the transition is made from the die attach area to the encapsulated area, resulting in potential solder joint reliability issues. As the encapsulated device cools down from the cure temperature of the encapsulant, the larger contraction of the substrate outside of the chip footprint area tends to cause buckling in that area. The mechanical stresses imposed on solder joints by this buckling contributes to early fatigue failure of the solder joints.

SUMMARY OF THE INVENTION

Now, according to the present invention, an improved IC chip packaging method and assembly has been developed, whereby an integrated circuit chip is encapsulated in a body of the desired dimensions prior to rather than subsequent to, attachment of the chip to a package substrate. By encapsulating the IC in a body of the desired size prior to substrate attachment, chip bonding adhesive then can be uniformly dispensed substantially over the encapsulated chip body, or its entire footprint on the substrate surface. Uniform properties at the interface of the substrate to the chip or encapsulated body can be assured, in that the adhesive layer can be continuous across the entire area of the chip and substrate interface. This results in improvement in solder joint reliability performance.

The present invented method of packaging an integrated circuit chip comprises:

masking the active circuit side of an integrated circuit chip;

forming an encapsulated chip by encapsulating the non-active side of the integrated circuit chip in an encapsulant material;

removing the masking to expose the active circuit side of the chip; and, attaching the encapsulated chip to a surface of a packaging substrate using a bonding adhesive wherein the bonding adhesive extends over an interface formed between the encapsulated chip and the substrate.

In wafer scale packaging, the final package is the size of the chip, as all packaging, consisting basically of a flip chip redistribution layer and solder ball attachment is done in a batch mode, prior to wafer dicing. According to the present invention, wafer scale packages can be made larger than chip size by dicing prior to redistribution, expanding the diced chip array to the desired size, encapsulating the entire wafer, now an array of diced chips, removing the temporary tape, and then proceeding on to batch mode redistribution of the larger than wafer size array. In real chip size chip scale packaging technologies, the finished package must be real chip size because the problem of assuring similar behavior under thermal stress when mounted to a printed circuit board of solder balls outside the chip shadow and solder balls inside the chip shadow has not been solved, for devices which rely on a compliant die attach between the substrate and chip to assure solder joint reliability, which is most chip scale package types. According to the present invention, by providing a continuous surface between the encapsulated chip and encapsulation on which to deposit the compliant die attach, continuous properties and uniform behavior of solder balls inside and outside the chip shadow are assured.

BRIEF DESCRIPTION OF THE DRAWINGS

For a further understanding of the nature of the present invention, as well as other features and advantages thereof, reference should be made to the following detailed description taken in conjunction with the accompanying drawings wherein.

DETAILED DESCRIPTION

Figure 1:
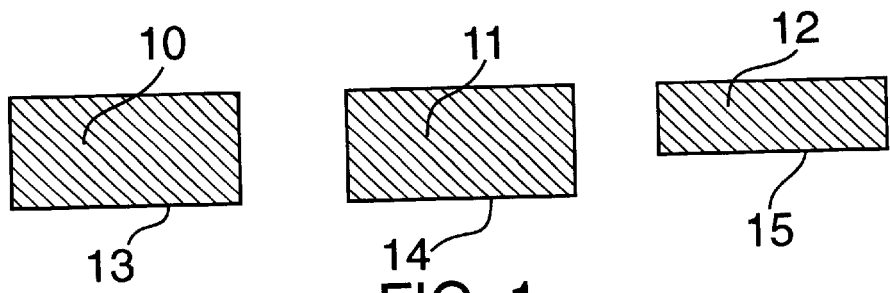
FIGS. 1–4 are simplified, magnified, cross-sectional views depicting, in sequence, the process steps for packaging an integrated circuit chip according to the present invention.
Figure 2:
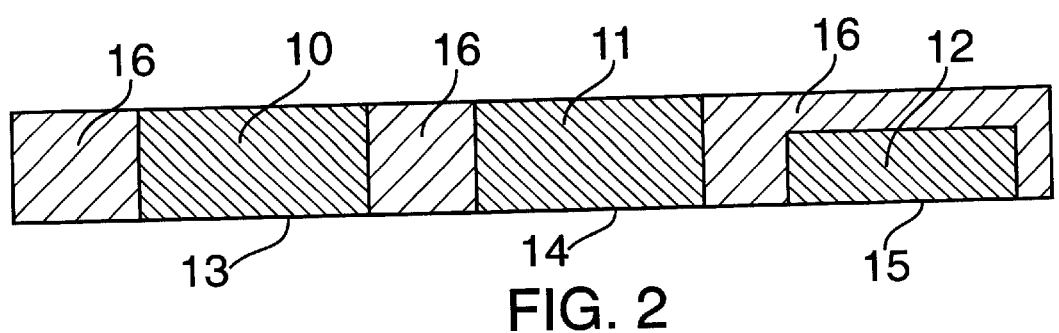

Referring to FIG. 1, integrated circuit chips 10, 11 and 12 are shown, which have been sawn from a semiconductor wafer. Prior to bonding the chips to a packaging substrate, the active circuit sides 13, 14 and 15 of the chips are temporarily protected, for example by an adhesive film, as is commonly used in the art to shield the active side of a chip during operations such as sawing a wafer into discrete chips, or simply by applying pressure against the chip as it is positioned active side down on a suitable compliant surface (not shown). The chips then are encapsulated by applying an encapsulant over the non-active side of the chips. Such encapsulant typically may be epoxy materials, such as are commonly employed as encapsulant materials in semiconductor packaging. Such epoxy encapsulants include novolac, biphenyl, and multifunctional epoxies. A preferred encapsulant is biphenyl epoxy. Preferably, the encapsulant features thermal expansion characteristics compatible with the package materials and the intended use and location of the package. Preferably, the encapsulant features a low modulus, a high resistance to heat, and high resistance to moisture. The encapsulant generally may be applied by transfer molding techniques, or by dispensing. Curing of the encapsulant should be controlled so as to preserve the release properties of the temporary protective adhesive film, if such is employed to protect the active circuit side of the chip.

Once the chips are encapsulated by the encapsulant material, the temporary protection then is removed and the chips, secured by encapsulant 16, are ready for bonding to a packaging substrate. The substrate material may be any of the substrate materials known in the art of semiconductor packaging. Typical substrate materials include metal epoxy build-up, metallized epoxy glass, metallized polyimide, a leadframe, and an insulator which can be patterned for subsequent metallization and electrical bonding. Metallization and insulation within the substrate may be single or multiple layers, as required for necessary wiring escapes, and may, as well, include vertical interconnections within the substrate.

Figure 3:
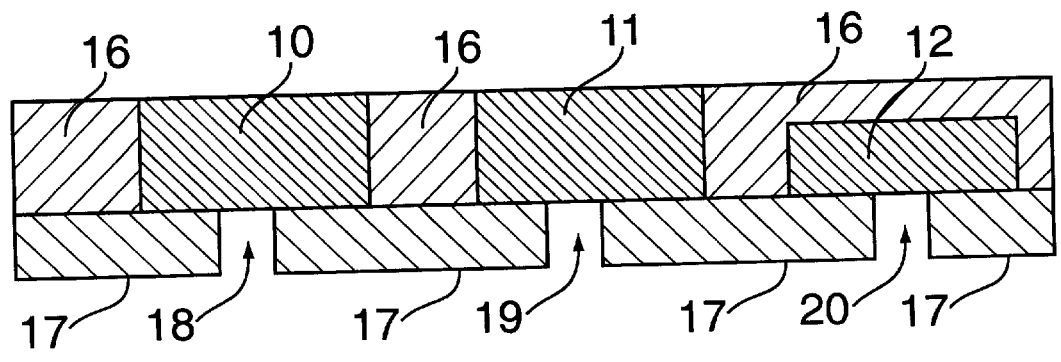

Referring to FIG. 3, in order to bond the encapsulated chips to the substrate 17, a bonding adhesive (not shown) is applied over the active face side of the chip body and encapsulant or the entire footprint of the encapsulated chip and encapsulant on the substrate surface, and the encapsulated chips are set in place as shown in FIG. 3. The bonding adhesive may be a tape preform, or, preferably, comprises a liquid bonding adhesive such as a silicone, an epoxy, or a polyimide. Openings 18, 19 and 20 in the substrate 17, provide access to contacts on the active sides of the chips for subsequent electrical bonding.

Figure 4:
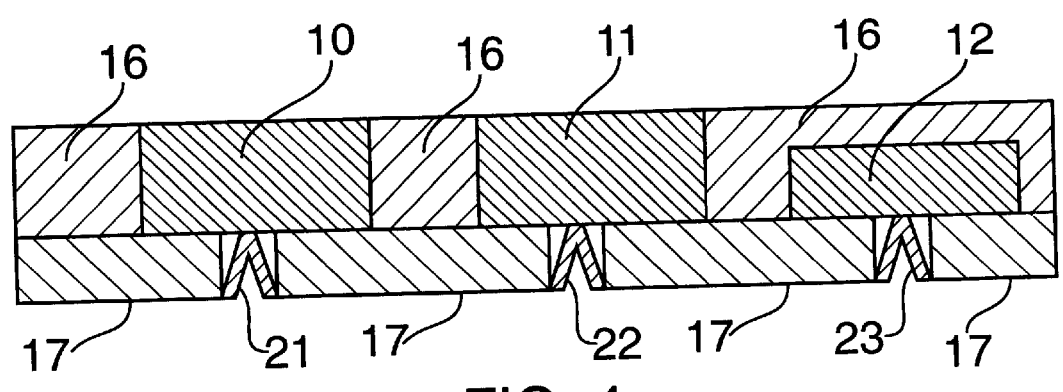

By encapsulating the chip to form a body of the desired dimensions prior to bonding of the chip to the substrate, then uniformly dispensing adhesive in a continuous manner over the chip and the encapsulant area or the footprint of the encapsulated chip on the substrate, uniform physical properties at the interface of the substrate to the IC chip or encapsulation area can be accomplished. As shown in FIG. 4, the encapsulated chips, 10, 11 and 12 bonded to the substrate 17, then can be electrically bonded by any conventional bonding techniques, such as TAB bonding, wire bonding, and the like. FIG. 4 shows wire bonding 21, 22 and 23 extending to contact points on the active sides of the IC chips.

Figure 5:
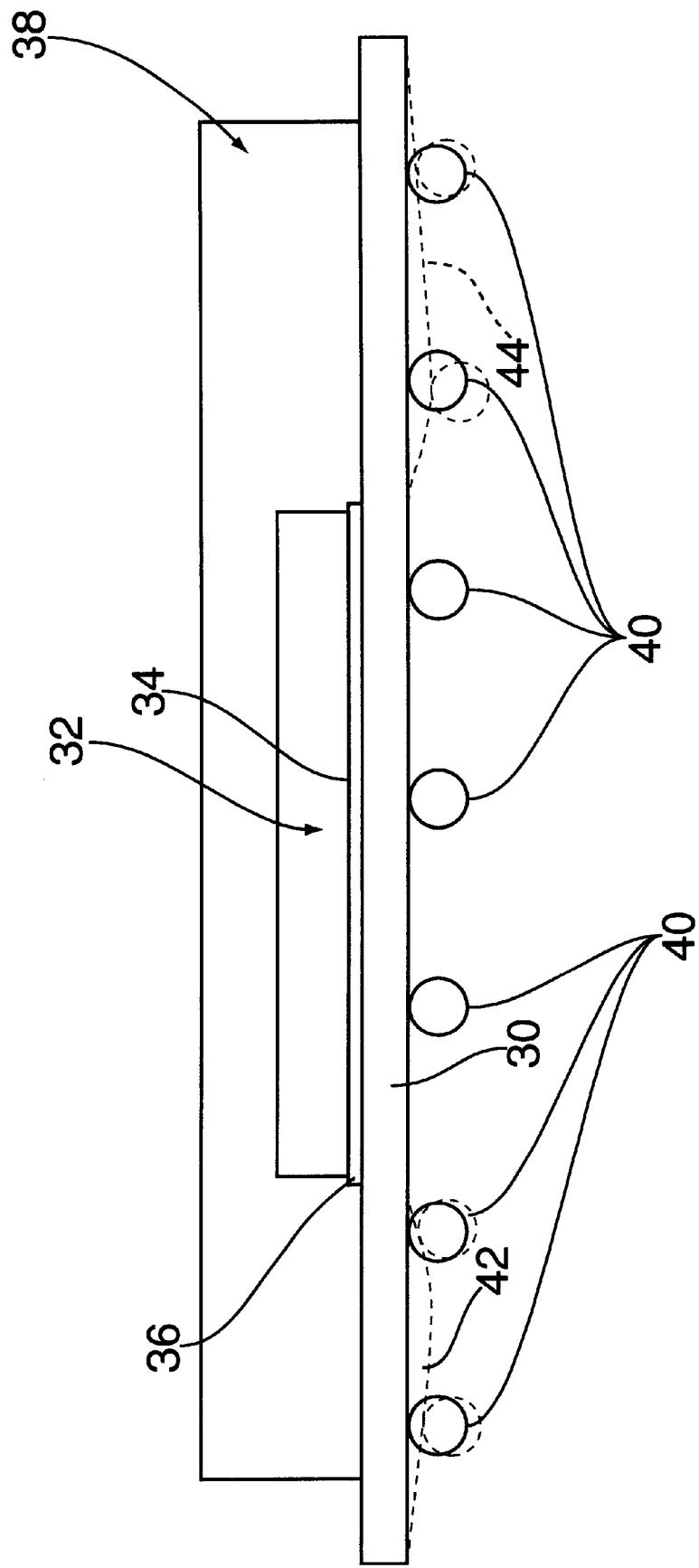
FIG. 5 is a simplified, magnified, side view depicting a prior art packaging arrangement with encapsulation applied subsequent to chip bonding to substrate.

FIG. 5 illustrates a prior art IC packaging embodiment fabricated by a method in which an encapsulant is employed, but is applied subsequent to bonding the IC to the substrate, rather than the present invented method wherein the encapsulant is applied to encapsulate the IC prior to bonding the IC to the substrate. Referring to FIG. 5, an epoxy glass substrate 30 is shown, to which an integrated circuit chip 32 is bonded, active circuit side 34 facing the substrate 30, through use of a silver filled epoxy bonding adhesive 36. The bonding adhesive 36 is utilized either by applying it directly over the active side 34 of the circuit chip 32 or by applying it to the intended footprint of the circuit chip 32 on the substrate and then setting the chip in place on the intended footprint or the substrate. Once the chip 32 is bonded to the substrate 30 by bonding adhesive 36, a silica filled epoxy encapsulant 38 is applied to fully encapsulate the chip 32 and further seal it to the substrate 30. Depicted on the base of substrate 30 is an array of solder balls 40 set in positions of signal input/output positions of the substrate. When the IC package is mounted on a circuit board (not shown), the solder balls are melted to connect the input/output positions of the package to terminals on the board.

In the prior art packaging embodiment shown, a potential solder joint reliability issue arises from the resultant structure. The solder joint reliability issue arises due to mechanical stresses imposed on the joints. To explain the origin of the imposed mechanical stresses, the depicted packaging embodiment includes an integrated circuit chip 32 having a typical thermal expansion of 4 ppm/°C., a substrate 30 with a typical thermal expansion of 17 ppm/°C., a silver filled epoxy bonding adhesive 36 with a typical thermal expansion of 30 ppm/°C., and a silica filled epoxy encapsulant 38 having a thermal expansion of 17 ppm/°C. As the package cools, the larger contraction of the substrate 30 outside the area of the footprint of chip 32 (interface of chip to substrate 30 through bonding adhesive 36) tends to cause buckling and attendant fatigue on the solder joints in that area, as depicted by phantom dotted lines 42 and 44.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

What is claimed is:

1. A method of packaging an integrated circuit chip having an active circuit side and a non-active side comprising:

masking the active circuit side of an integrated circuit chip;

forming an encapsulated chip by encapsulating the non-active side of the integrated circuit chip in an encapsulant material;

removing the masking to expose the active circuit side of the chip; and, attaching the encapsulated chip active circuit side down to a surface of a packaging substrate using a bonding adhesive wherein the bonding adhesive extends over an interface formed between the encapsulated chip and the substrate.

2. The method of claim 1 wherein the bonding adhesive has properties to assure uniform solder joint behavior of solder joint terminations on the area of substrate below the area of the encapsulant and solder joint terminations or the area of substrate below the area of the integrated circuit chip.

3. The method of claim 1 wherein the bonding adhesive extends substantially over an interface of the encapsulated chip and substrate.

4. The method of claim 1 wherein the encapsulated chip is attached to the surface of the substrate using a bonding adhesive extending over substantially the entire interface of the substrate and the encapsulated chip.

5. The method of claim 4 wherein the integrated circuit chip is encapsulated with an epoxy composition.

6. The method of claim 1 wherein the bonding adhesive comprises a liquid bonding composition.

7. The method of claim 1 wherein the bonding adhesive is a tape preform.

8. A method of packaging an integrated circuit chip having an active circuit side and a non-active side comprising:

masking the active circuit side of an integrated circuit chip;

forming an encapsulated chip by encapsulating the non-active side of the integrated circuit chip in an epoxy composition encapsulant material;

removing the masking to expose the active circuit side of the chip; and, attaching the encapsulated chip active circuit side down to a surface of a packaging substrate using a bonding adhesive wherein the bonding adhesive extends substantially over an interface formed between the encapsulated chip and the substrate.

* * * * *